(12) United States Patent
Di Stefano

(10) Patent No.: US 6,998,703 B2
(45) Date of Patent: Feb. 14, 2006

(54) THIN PACKAGE FOR STACKING INTEGRATED CIRCUITS

(75) Inventor: Thomas H. Di Stefano, Monte Sereno, CA (US)

(73) Assignee: Palo Alto Research Center Inc., Palo Alto, CA (US)

( * ) Notice: Subject to any disclaimer, the term of this patent is extended or adjusted under 35 U.S.C. 154(b) by 47 days.

(21) Appl. No.: 10/729,557

(22) Filed: Dec. 4, 2003

(65) Prior Publication Data
US 2005/0121758 A1    Jun. 9, 2005

(51) Int. Cl.
   *H01L 23/02* (2006.01)
(52) U.S. Cl. ............................. 257/686; 257/735
(58) Field of Classification Search ........... 257/678, 257/723, 700, 686, 692, 735
   See application file for complete search history.

(56) References Cited

U.S. PATENT DOCUMENTS

| | | | |
|---|---|---|---|
| 5,172,303 A | 12/1992 | Bernardoni et al. ........ 361/396 |
| 5,281,852 A * | 1/1994 | Normington ............... 257/685 |
| 5,313,096 A | 5/1994 | Eide .......................... 257/686 |
| 5,478,781 A | 12/1995 | Bertin et al. ............... 437/209 |
| 5,517,754 A | 5/1996 | Beilstein, Jr. et al. ...... 29/840 |
| 5,613,861 A | 3/1997 | Smith et al. |
| 5,615,824 A | 4/1997 | Fjelstad et al. .......... 228/180.1 |
| 5,632,631 A | 5/1997 | Fjelstad et al. .............. 439/82 |
| 5,783,870 A | 7/1998 | Mostafazadeh et al. ..... 257/791 |
| 5,786,628 A * | 7/1998 | Beilstein et al. ............ 257/684 |
| 5,910,885 A | 6/1999 | Gulachenski et al. ....... 361/774 |
| 6,002,170 A | 12/1999 | Kim et al. ................... 257/698 |
| 6,013,948 A | 1/2000 | Akram et al. ............... 257/698 |
| 6,180,881 B1 | 1/2001 | Isaak ......................... 174/52.4 |
| 6,290,510 B1 | 9/2001 | Fork et al. |
| 6,383,840 B1 | 5/2002 | Hashimoto .................. 438/109 |
| 6,475,831 B2 | 11/2002 | Moden et al. ............... 438/109 |
| 6,476,626 B2 * | 11/2002 | Aldaz et al. ................ 324/757 |
| 6,486,546 B2 | 11/2002 | Moden et al. .............. 257/686 |
| 6,507,095 B1 | 1/2003 | Hashimoto .................. 257/678 |
| 6,627,980 B2 | 9/2003 | Eldridge |
| 2005/0006829 A1 | 1/2005 | Chow et al. |

OTHER PUBLICATIONS

Joseph Fjelstad, Neo-Manhattan Technology—A novel HDI Manufacturing Process (IPC Flex and Chips Symposium, Tempe, AZ Feb. 11-12, 2003.

* cited by examiner

*Primary Examiner*—Roy Potter
(74) *Attorney, Agent, or Firm*—Kent Chen

(57) ABSTRACT

An improved structure and method for making interconnects for a thin package of stacked integrated circuits is described. The structure uses a spring contact to replace traditional solder balls in a stacked structure. The spring contacts are incorporated in an integrated circuit layer and may be made from stressed metal or physical bending of a metal structure. The spring contacts enable electrical coupling to adjacent circuit layers immediately above or immediately below the integrated circuit layer.

28 Claims, 3 Drawing Sheets

THIN PACKAGE FOR STACKING INTEGRATED CIRCUITS

BACKGROUND

Modern digital devices require large amounts of memory. In order to pack large amounts of memory into a small package, semiconductor manufacturers have stacked integrated circuit chips within a single package. Wire bonding techniques are used to interconnect integrated circuits stacked within the same package. However, the wire bonding of stacked structures is difficult, and thus expensive, for stacks of larger numbers of chips. Furthermore, providing wire bonding to the chips after stacking makes it difficult to test each integrated circuit layer before stacking. Failure to test individual chip layers before assembly often results in an unacceptably low yield rate in the final stacked package.

In order to improve yield and thereby reduce manufacturing cost of stacks including large numbers of chips, the industry has adopted the practice of packaging and testing each chip before stacking. The defective chips are eliminated before stacking into a final stacked chip assembly. In order to facilitate testing, chips are packaged into thin testable packages, or "paper-thin packages." In order to stack as many integrated circuit layers as possible per unit volume, each layer is kept as thin as possible. Thus chips have been thinned to thicknesses as low as 75 micrometers in production, and 35 micrometers in developmental prototypes. Chip thickness now represents less than half of the total thickness of a stacked package; thus integrated circuit chip thickness is no longer the limiting factor that determines package thickness. Instead, interconnections represent the major factor limiting package thickness.

The most common stacking interconnection is a ball stack as described in U.S. Pat. No. 5,783,870 entitled "Method of Connecting Packages of a Stacked Ball Array Structure". In a ball stack, solder balls are placed along the periphery of the package. A solderable contact pad is located above each solder ball. Each solder ball is typically between 0.3 to 0.5 mm in diameter. The ball height should be large enough to reliably accommodate any thermal expansion mismatches between the materials. Making ball diameters substantially smaller than 0.3 mm increases ball cracking and failure rates due to thermally activated mechanical stress.

Assuming a minimum ball size of 0.3 mm and a thin core printed wiring board of approximately 0.15 mm results in each ball stack package having a height of around 0.4–0.5 mm. An eight high stack of chips is typically around 3.6 mm high. Current design objectives target 1.2 mm as a maximum height for any stacked package as determined by the size of the electronic system. In order to fit within the 1.2 mm required height, each layer of an eight layer stack is typically no higher than 0.15 mm.

A second problem with ball stack systems results from the elevated temperatures used to melt the balls and attach the layers. These elevated temperatures result in package flow and deformation problems. During solder attach of a conventional stacked package assembly, the solder balls in the stack melt and allow the stack of individually packaged chips to move.

Other packaging techniques have been described such as microelectronic spring contacts as described in U.S. Pat. No. 6,627,980 B2 entitled "Stacked Semiconductor Device Assembly With Microelectronic Spring Contacts." However, the described stacking techniques are not laterally compact due to factors such as staggered stacking.

Thus a new method of interconnecting stacked integrated circuit layers is needed.

DETAILED DESCRIPTION

A method and apparatus for forming a composite connect structure that interconnects adjacent layers in a stack of integrated circuit packages is described. The system uses spring contacts to provide vertical in-line connections between package layers. These spring contacts result in very thin stacks of integrated circuits.

Figure 1:
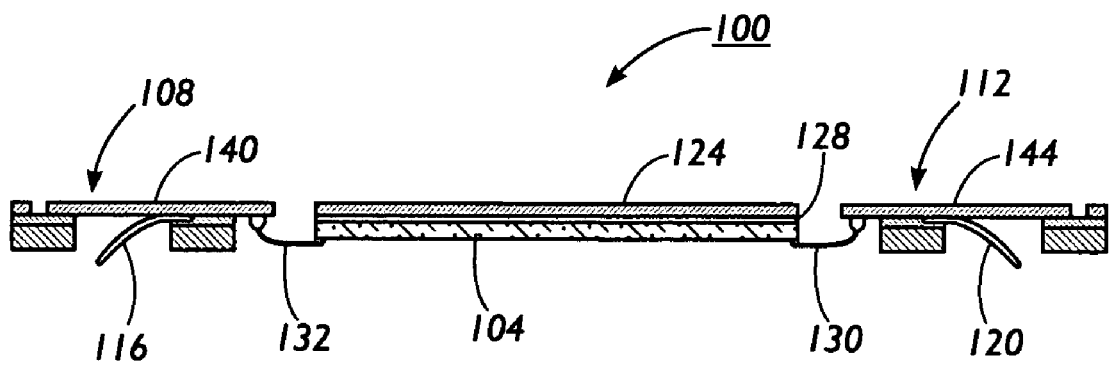
FIG. 1 shows a side cross sectional view of a stackable package layer including a semiconductor chip and a compliant composite connect structure.
Figure 2:
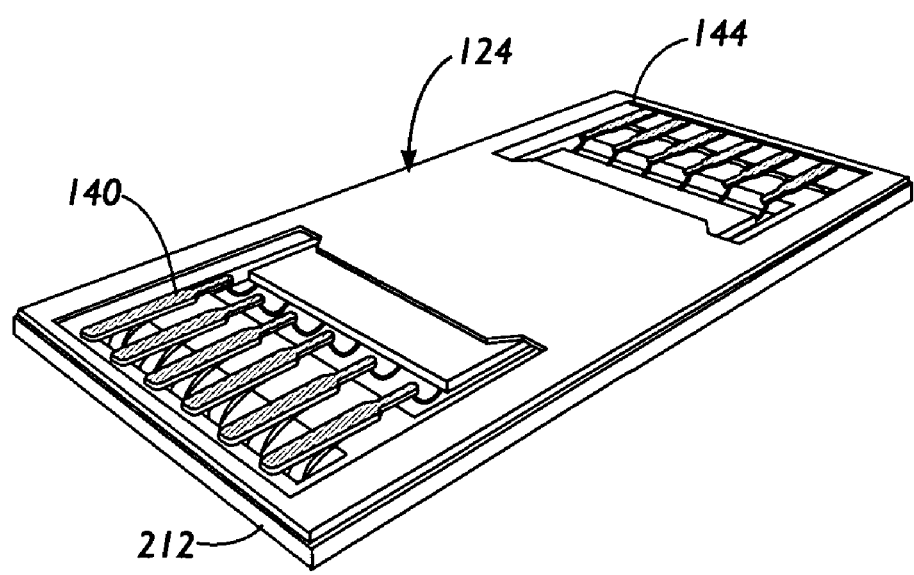
FIG. 2 shows a top view of a stackable package including a compliant composite connection structure.
Figure 3:
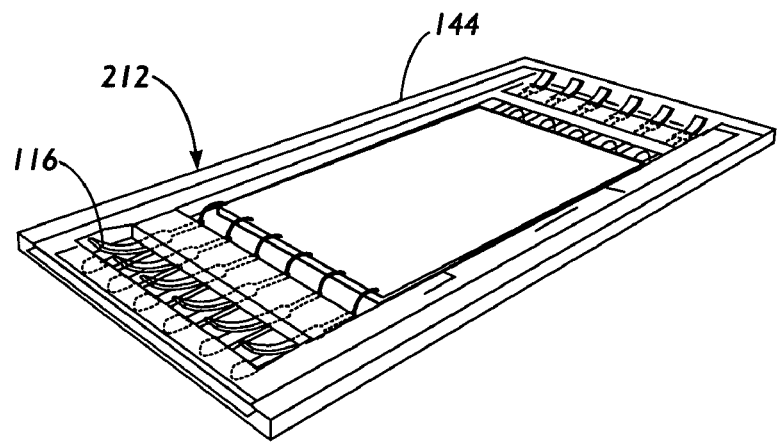
FIG. 3 shows a bottom view of a stackable package including a compliant composite connection.

FIG. 1 shows a cross sectional side view of a single layer 100 of a semiconductor chip or die 104 and associated compliant connect structures 108, 112. FIG. 2 provides a top view of single layer 100. FIG. 3 illustrates a bottom view of single layer 100.

Each connect structure 108, 112 includes a spring contact 116, 120 that can be compressed into contact pads of a different layer. Spring contacts 116, 120 are preferably designed to withstand several clamping or compression cycles enabling contact and removal from a testing socket. Thus interim testing of the circuits on single layer 100 before final assembly is easily accomplished. During such testing, contact springs 116, 120 are urged against corresponding mating terminals on a socket used to test single layer 100.

In one embodiment, the spring contacts are formed by depositing a metal layer over a release layer. A gradient stress in the deposited metal layer is formed by adjusting the doping composition and deposition rate as the metal layer is deposited. Photolithographic techniques may be used to mask the structure. An etchant etches around the mask to form the springs into a desired shape. Release layer removal releases the stressed metal such that the gradient stress forces the metal out of the deposition plane. Extensive detail on the design and fabrication of such spring contacts is described in U.S. Pat. No. 5,613,861 by Don Smith entitled "Photolithographically Patterned Spring Contact" and also by U.S. Pat. No. 6,290,510 by David Fork et al. entitled "Spring Structure with Self-Aligned Release Material", both patents are hereby incorporated by reference in their entireties. An alternate method of designing such spring contacts is described in the description associated with FIG. 6.

To assemble a stackable package, each integrated circuit chip or die 104 mounts on a thin die paddle 124. Die paddle 124 is preferably made from a material with a high thermal conductivity, such as copper. The die paddle assists in dissipating heat generated by the circuits in die 104. In one embodiment, the die paddle 124 couples to a heat sink.

In the illustrated embodiment, a thin die attach adhesive 128, such as 84–1 LMISR4, a silver filled epoxy from Ablestick Corporation, attaches die 104 to die paddle 124. Perforations or segmentation of die paddle 124 allows die attach adhesive 128 to flow out reducing bubble formation between die 104 and die paddle 124. Die paddle 124 segmentation also reduces mechanical stress and warpage due to differential expansion between die 104 and die paddle 124.

Bond wires 132, 130 connect pads on die 104 to corresponding top contacts 140, 144. Each top contact 140, 144 is coupled to corresponding spring contacts 116, 120. Top contact 140, 144 is typically a thin conducting layer. In the illustrated embodiment, top contact 140, 144 is an 18 micrometer thick layer of copper alloy 7025, available from Olin Brass, East Alton, Ill. Top contact 140, 144 includes a wire bondable gold coating of approximately 1 to 5 micrometer thickness on an intermediate nickel layer of 1 to 10 micrometer thickness. As seen from FIG. 2, the top contact 140, 144 are approximately in the same layer and disconnected from the die paddle. Using the same material to simultaneously form die paddle 124 and top contacts 140, 144 simplifies the fabrication process.

Spring contacts 116, 120 are typically formed from a metal with a stress gradient. Stressed metal springs are typically formed by depositing each layer of the spring under different deposition conditions, typically by sputtering a metal over a substrate under different pressures in a vacuum chamber. In one embodiment, the pressure is gradually raised in the chamber as the metal layer is deposited such that lower metal layers are compressed and upper metal layers are tensile. These conditions cause an internal stress gradient in the metal which is bonded to the substrate by a release material. When the release material is removed, usually by means of an etching process, the metal curls into a curved spring structure. The spring material is often a nickel alloy, as previously described in previously incorporated patent reference U.S. Pat. No. 6,290,510. In one embodiment of the invention, the substrate is a conductor and is used as a top contact such as top contact 140, 144. The curved spring which was "released" from the top contact serves as spring contact 116, 120.

Alternately, the formation of springs may be done more inexpensively by using a plated stress metal process rather then a sputtered process as described in U.S. patent application Ser. No. 10/615,653 entitled "High Force Metal Plated Spring Structure" by Eugene Chow et al. filed Jul. 8, 2003 and hereby incorporated by reference. Still, an even more inexpensive fabrication technique involves simply bending the frame (typically the die paddle). After formation, the spring may be plated to improve conductivity.

When very high conductivity is desired, an excellent conductor such as gold may be used to coat spring contacts 116, 120. Top contacts 140, 144 may also be gold plated to facilitate formation of a reliable contact with corresponding spring contacts. The entire stackable package forms a "paper thin package."

Figure 4:
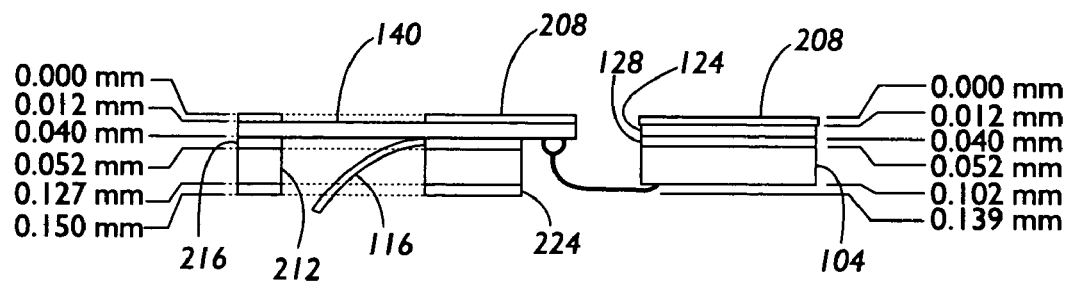
FIG. 4 shows an expanded cross sectional side view of the compliant composite connect structure.

FIG. 4 shows an expanded sectional view of the compliant composite interconnection structure and associated die together with possible dimensions. In the illustrated embodiment, the die region has a thickness of approximately 133 micrometers. Die 104 is approximately 50 micrometers thick. A 12-micrometer thick adhesive layer 128 couples die 104 to a 28 micrometer thick die paddle 124. An approximately 12 micrometer thick insulating dielectric material 208 prevents die paddle 124 from shorting dies that may be positioned above die 104.

FIG. 4 shows an example of an approximately 150 micrometer thick composite connect structure. The composite connect structure includes a dielectric material 208, typically a solder mask material such as DuPont Riston, deposited over portions of top contact 140. Dielectric material 208 prevents electrical shorting with other stack layers. The illustrated embodiment shows a 12 micrometer thick dielectric material 208 and a 28 micrometer thick top contact 140.

Dielectric body 212 supports portions of top contact 140. Dielectric body 212 also provides support and dimensional integrity to the overall structure and may be formed from any dimensionally stable dielectric including, but not limited to, polyiminide, FR-4, BT epoxy resin, or a cyanate ester material. As shown in FIG. 3, dielectric body 212 forms a "frame" around die 104 and also a "frame" around openings for the interconnects. Contact springs 116 extend beyond the thickness of dielectric body 212 frame. Thus tips of contact springs 116 extend beyond a lower surface of dielectric body 212.

In the illustrated embodiment, a dielectric adhesive 216 couples dielectric body 212 to top contact 140. A second layer of dielectric adhesive 224 couples dielectric body 212 to subsequent circuit layers. The thickness of combined dielectric body 212, and dielectric adhesive layers 216, 220 is only slightly greater than the combined thickness of die 104 and die adhesive layer 128. FIG. 4 shows a 75 micrometers thick dielectric layer 212 coupled to a 12 micrometers thick dielectric adhesive layer 216 and a 23 micrometers thick second dielectric adhesive layer 128, resulting in a combined thickness of approximately 110 micrometers. The 110 micrometer thickness is only slightly thicker than the 62 micrometer thickness of the die and die adhesive. The thickness of the entire structure is approximately 150 micrometers thick.

A 150 micrometer thick layer results in an eight chip high layer that measures approximately 1.2 mm in total height. In the illustrated structure, the stacked package to package interconnections are no longer the dominant factor limiting thickness of the stacked package. Thinner layers may be formed if technological advancements enable the formation of thinner integrated circuit dies. Thinner dies combined with a commensurate reduction in the thickness of the dielectric bodies enable thickness reductions in each layer. Although the thickness of die paddle 124 may also be reduced, because die paddle 124 manages heat dissipation, substantial reductions in die paddle 124 thickness may make thermal management difficult unless new circuits which generate less heat are designed.

In addition to being thinner than prior art ball stack interconnects, the illustrated design also permits a higher density of contacts. Ball contact stacks arranged in a standard grid patterns of at least 0.75×0.75 mm results in a 178 contacts per square centimeter density. In contrast, compliant composite connection structures offer a 400 contacts per square centimeter density. Thus, in addition to providing a thinner profile structure, the spring interconnects use less area than an equivalent ball stack package. The positioning of the spring connects in a linear column also minimizes the lateral area required by contact structures compared with other contact arrangements.

Figure 5:
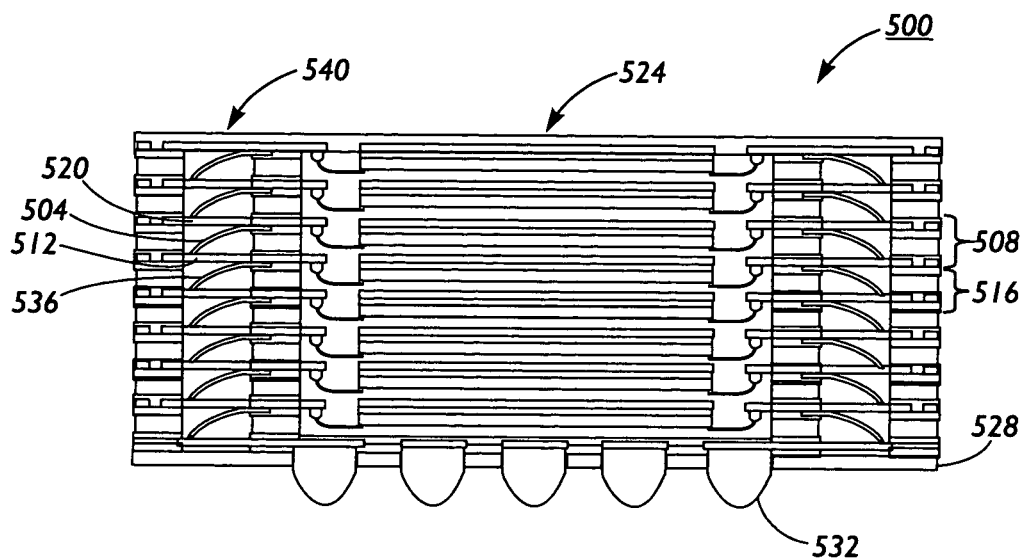
FIG. 5 shows eight stackable package layers stacked together to form a thin stacked integrated circuit package.

FIG. 5 shows eight layers stacked together to form a stack circuit 500. Prior to assembly of the stack layer, each die layer is tested. After testing, the layers are aligned in an alignment fixture such that spring 504 from an upper layer 508 engages the top contact 512 of a lower layer 516. Alignment features such as holes, grooves, notches or other geometric elements may be incorporated into each layer to facilitate alignment. The lower layer 516 is immediately adjacent to and beneath upper layer 508. When spring 504 engages lower layer top contact 512, spring 504 rolls up against upper layer top contact 520.

After all springs have engaged a layer immediately adjacent the spring, the stack is clamped and heated to a cure temperature that causes a b-stage epoxy adhesive layer to flow around the spring and seal the spring into place. Thus both spring tension and a cured epoxy film hold the springs in place against the adjacent contact elements. In one embodiment of the invention, a b-staged epoxy adhesive layer such as Tomogawa X is included between stages. Alternative adhesives include acrylic layers from Dupont or thermoplastic polymides from PI R&D Corporation of Japan. Although spring force alone may be sufficient to maintain contact, the addition of an epoxy film helps to avoid fritting caused by differential movement of the spring and its respective contact element.

After completion of assembly, the springs are sealed in a protected cavity in the completed stack. A sealing cap layer 524 seals the top, while a bottom layer 528 seals the bottom. Typically sealing cap 524 is a dielectric. However sealing cap 524 may also include contact pads for addressing circuit elements in the die. Likewise, bottom layer 528 may include wire bonds to contacts that enable an electrical connection to an external circuit. In the illustrated embodiment, bottom layer 528 includes a ball grid array (BGA) 532 for contact between external circuit elements and the stack.

FIG. 5 shows the spring contact elements aligned such that upper spring 504 is directly aligned with the next spring 536. Such alignment is made possible by the alignment of each spring 504, 536 with corresponding contact elements 512, 520. Stacking forms a vertical bus column 540.

Figure 6:
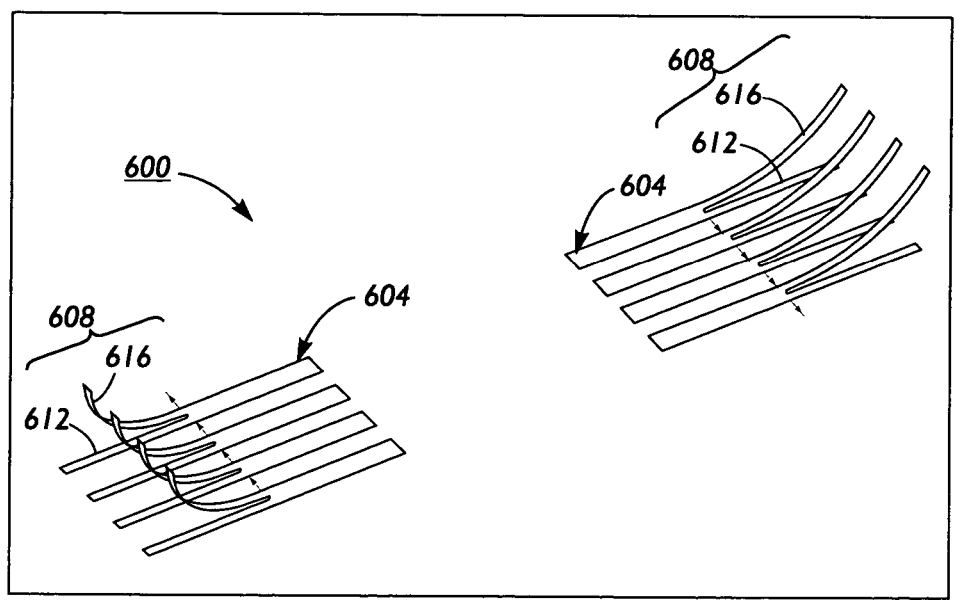
FIG. 6 shows an alternative to using stressed metal to form the spring contact by instead, bending a portion of the top contact.

Although stressed metals deposited on top contacts is one way to form a spring structure, an alternative method substitutes a bent portion of the top contact to form a spring. FIG. 6 shows a series of top contact elements 600, that use bent top contacts as springs. In FIG. 6, each top contact includes a base portion 604 and a contact portion 608. Base portion 604 couples to a dielectric body. Contact portion 608 makes electrical contact with different stacked layers. In the illustrated embodiment, contact portion 608 is further split and divided into a flat portion 612 and a bent portion 616.

The side view of each layer appears the same as that of FIG. 1, except that spring contact 116 instead of being formed from stressed metal, is now a portion of the top contact element 600. However, a top view of the structure differs from the stressed metal embodiments of the invention because the bent portion 616 is not directly underneath a flat portion of the top contact.

When used in a stacked structure, bent portion 616 of a contact in an upper layer such as layer 508 of FIG. 5 typically couples to the flat portion 612 of an immediately lower layer such as lower layer 516. In order to achieve such alignment, the bent portion 616 of the top layer should match the flat portion 612 of an immediately lower layer. Thus adjacent layers are no longer identical, instead, stacking forms an alternating structure in which the bent portion 616 of the spring alternates each layer, between the right side and left side of contact portion 608. Thus, when a stack layer is bent on a right side of contact portion 608, the stack layer immediately below will have flat contact portions on the right side to couple to the bent right side of contact portion 608.

A number of techniques may be used to form the bent spring structure. In one embodiment, the contact portions are initially patterned. Photolithographic processes combined with etches that are known to those of skill in the art may be used to shape the initial contact portion 608. A spring press or other forming tool bends a portion of the top contact in a stamping process to form the bent portion. Alternately, molding the structure into the desired shape, or other mechanical or chemical processes may be used to create the bent shape. After bending, electroplating a high conductivity conductor onto the bent structure improves the conductivity characteristics of the bent portion.

The preceding description includes a number of details such as design architectures and suitable materials for forming the stacked array. These details are provided to facilitate understanding of the invention and to provide examples of various embodiments of the invention and how they may be used. However, such illustrative details are provided for examples only and should not be construed to limit the scope of the invention. Instead the invention should only be limited by the claims which follow.

What is claimed is:

1. A two sided stackable electrical contact structure comprising:
a first dielectric layer having a thickness of less than 0.25 millimeters, the dielectric material having a first surface and at least one edge;
a first conducting strip including a first end and a second end, the first end of the first conducting strip coupled to the first surface of the dielectric material, the second end of the conducting strip including a top contact portion that extends beyond the edge of the dielectric material;
a first curved spring, the curved spring including a proximal end coupled to the first end of the conducting strip, the first curved spring including a tip end that includes a point separated by a predetermined distance from a plane including the first surface of the first dielectric layer, the predetermined distance greater than the thickness of the first dielectric layer.

2. The two sided stackable electrical contact structure of claim 1 wherein the predetermined distance is between 0.1 millimeters and 0.5 millimeters.

3. The two sided stackable electrical interconnect structure of claim 1 wherein the first curved spring is a stressed metal spring.

4. The two sided stackable electrical interconnect structure of claim 1 wherein the tip of the first curved spring is positioned directly below the conducting strip.

5. The two sided stackable electrical interconnect structure of claim 1 wherein the first curved spring is positioned adjacent to the top contact portion.

6. The two sided stackable electrical interconnect structure of claim 1 wherein the first conducting strip couples to an integrated circuit.

7. The two sided stackable electrical interconnect structure of claim 1 further comprising:
a second dielectric layer,
a second conducting strip coupled to the second dielectric material, the second conducting strip including a top contact portion that extends beyond a corresponding edge of the second dielectric material, the tip of the first curved spring forming an electrical contact with the second conducting strip.

8. The two sided stackable electrical interconnect structure of claim 7 further comprising:
a second curved spring, the second curved spring including a corresponding second proximal end coupled to the second conducting strip.

9. The two sided stackable interconnect structure of claim 5 wherein the first conducting strip couples to a first integrated circuit and the second conducting strip couples to a second integrated circuit positioned beneath the first integrated circuit.

10. The two sided stackable interconnect structure of claim 7 wherein the first conducing strip is directly above both the first curved metal spring and the second conducting strip.

11. The two sided stackable interconnect structure of claim 7 wherein the first conducting strip is adjacent to the first curved spring and the first curved spring is directly above the second conducting strip.

12. The two sided stackable interconnect structure of claim 1 wherein the first conducting strip is approximately planar.

13. The two sided stackable interconnect structure of claim 7 wherein the second conducting strip is approximately planar.

14. The two sided stackable interconnect structure of claim 1 wherein the first curved spring is metal.

15. The two sided stackable electrical interconnect structure of claim 8 further comprising:
 a third dielectric layer;
 a third conducting strip coupled to the third dielectric material, the third conducting strip including a top contact portion that extends beyond a corresponding edge of the third dielectric material, the tip of the second curved spring forming an electrical contact with the third conducting strip; and,
 a third curved spring, the third curved spring including a corresponding proximal end coupled to the third conducting ship, the third curved spring including a tip that forms a line with the second curved spring tip and the first curved spring tip.

16. The two sided stackable electrical contact structure of claim 1 wherein the first curved spring is formed by removing a release layer between the first conducting strip and the first curved metal spring.

17. The two sided stackable electrical contact structure of claim 1 wherein the curvature of the first curved spring results from an internal stress gradient.

18. The two sided stackable electrical contact structure of claim 17 wherein the internal stress gradient is caused by changing pressure during deposition of a metal that forms the first curved spring.

19. A stacked structure comprising:
 a first dielectric layer including a first plurality of electronic components and a first interconnect structuring extending over an edge of the first dielectric layer, the first interconnect structure including a first spring structure and a first top contact;
 a third dielectric layer including a third plurality of electronic components and a third interconnect structure extending over an edge of the third dielectric layer, the third interconnect structure including a third spring structure and a third top contact; and,
 a second dielectric layer positioned between the first dielectric layer and the third dielectric layer, the second dielectric layer including a second plurality of electronic components, the second dielectric layer including a second interconnect structure extending over an edge of the second dielectric layer, the second interconnect structure including a second top contact to receive an electrical contact from the first spring contact, and a second spring contact to couple to the third top contact.

20. The stacked structure of claim 19 wherein the first interconnect structure is directly above the second interconnect structure, and the second interconnect structure is directly above the third interconnect structure.

21. The stacked structure of claim 19 wherein the second spring is a stressed metal spring.

22. The stacked structure of claim 19 wherein the second top contact is an approximately planar rigid structure.

23. The stacked structure of claim 19 wherein the second plurality of electronic components is an integrated circuit.

24. The stacked structure of claim 19 wherein the thickness of the structure is less than 500 microns.

25. The stacked structure of claim 19 further comprising an epoxy that holds the second spring structure in contact with the third top contact.

26. The stacked structure of claim 19 further comprising:
 a fourth dielectric layer including a fourth plurality of electronic components and a fourth interconnect structure extending over an edge of the fourth dielectric layer, the fourth interconnect structure including a fourth spring structure and a fourth top contact, the fourth dielectric positioned beneath the third dielectric layer such that the third spring structure couples to the fourth top contact.

27. The stacked structure of claim 19 wherein the tip of the first curved spring, the tip of the second curved spring and the tip of the third curved spring from an approximate line.

28. A two sided stackable electrical contact structure comprising:
 a first dielectric layer having a first surface and at least one edge;
 a first conducting strip including a first end and a second end, the first end of the first conducting strip coupled to the first surface of the dielectric material, the second end of the conducting strip including a top contact portion that extends beyond the edge of the dielectric material;
 a first curved spring, the curved spring including a proximal end coupled to the first end of the conducting strip, the first curved spring including a tip end that includes a point separated by a predetermined distance from a plane including the first surface of the first dielectric layer, the predetermined distance greater than the thickness of the first dielectric layer.

* * * * *